United States Patent
Hsu et al.

(10) Patent No.: US 6,177,299 B1
(45) Date of Patent: Jan. 23, 2001

(54) TRANSISTOR HAVING SUBSTANTIALLY ISOLATED BODY AND METHOD OF MAKING THE SAME

(75) Inventors: Louis Lu-chen Hsu, Fishkill; Jack Allan Mandelman, Stormville, both of NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/007,908

(22) Filed: Jan. 15, 1998

(51) Int. Cl.[7] .................. H01L 31/119; H01L 29/76; H01L 21/8238; H01L 21/8242; H01L 21/76

(52) U.S. Cl. .................. 438/149; 438/219; 438/227; 438/244; 438/284; 438/406; 257/401; 257/329

(58) Field of Search ........................ 438/149, 244, 438/219, 212, 221, 227, 404, 284, 86; 257/401, 329

(56) References Cited

U.S. PATENT DOCUMENTS

| | | | |
|---|---|---|---|
| 4,648,173 | 3/1987 | Malaviya | 29/576 W |
| 4,649,625 | 3/1987 | Lu | 29/571 |
| 4,688,073 | 8/1987 | Goth et al. | 357/56 |
| 4,816,884 | 3/1989 | Hwang et al. | 357/23.6 |
| 4,833,516 | 5/1989 | Hwang et al. | 357/23.6 |
| 4,914,628 | 4/1990 | Nishimura | 365/149 |
| 4,988,637 | 1/1991 | Dhong et al. | 437/52 |
| 5,008,214 | 4/1991 | Redwine | 437/52 |
| 5,106,775 | 4/1992 | Kaga et al. | 437/52 |
| 5,264,716 | 11/1993 | Kenney | 257/301 |
| 5,346,834 | 9/1994 | Hisamoto et al. | 437/41 |
| 5,360,758 | 11/1994 | Bronner et al. | 437/52 |
| 5,443,992 | 8/1995 | Risch et al. | 437/29 |
| 5,466,625 | 11/1995 | Hsieh et al. | 437/52 |
| 5,466,636 | 11/1995 | Cronin et al. | 437/187 |
| 5,508,219 | 4/1996 | Bronner et al. | 437/52 |
| 5,528,062 | 6/1996 | Hsieh et al. | 257/298 |
| 5,547,903 | 8/1996 | Hsu | 437/203 |
| 5,581,101 | 12/1996 | Ning et al. | 257/347 |
| 5,585,657 | 12/1996 | Efland et al. | 257/335 |
| 5,614,431 | 3/1997 | Debrosse | 437/52 |
| 5,643,815 | 7/1997 | Vu et al. | 437/44 |
| 5,691,549 | 11/1997 | Lam et al. | 257/282 |
| 5,763,285 | * 6/1998 | Yang | 437/44 |
| 5,780,325 | * 7/1998 | Lee | 438/149 |
| 5,814,895 | 9/1998 | Hirayama | 257/903 |

FOREIGN PATENT DOCUMENTS 5-343679   12/1993   (JP)  .............. H01L/29/784

OTHER PUBLICATIONS

IBM Technical Disclosure Bulletin, vol. 32, No. 9A, Feb. 1990, High Density Dram Cell (Q–Elope Cell), pp. 478–482.

T. Ozaki, et al., "0.228m2 Trenc Cell Technologies with Bottle–Shaped Capacitor for 1Gbit DRAMs", 1995, IEEE, pp. 27.3.1–27.3.4.

D. Hisamoto, et al., "A Fully Depleted Lean–channel Transistor (DELTA) . . . ", IEEE, 1989, pp. 34.5.1–34.5.4.

* cited by examiner

Primary Examiner—Donald L. Monin, Jr.
Assistant Examiner—S. H. Rao
(74) Attorney, Agent, or Firm—Daryl K. Neff

(57) ABSTRACT

A method for forming a field effect transistor (FET) is disclosed which includes forming an isolation region in a substrate of semiconductor material, anisotropically etching the substrate such that a sidewall spacer region of semiconductor material remains on a sidewall of the isolation region as a device region of the FET. The isolation region may then be recessed such that, after gate conductor deposition, the central channel region of the device region is enclosed by the gate conductor. A dopant concentration in at least one of the central portion of the device region or regions flanking the central portion are then altered to form source-drain regions having a first dopant type and a channel region having a second dopant type opposite the first dopant type.

15 Claims, 5 Drawing Sheets

TRANSISTOR HAVING SUBSTANTIALLY ISOLATED BODY AND METHOD OF MAKING THE SAME

RELATED APPLICATION DATA

This application is related to Applicants' U.S. patent application entitled "Semiconductor Integrated Circuits" and further identified as Ser. No. 09/007,906, filed Jan. 15, 1998 filed on even date herewith, which application is incorporated herein in its entirety by reference.

FIELD OF THE INVENTION

This invention relates to integrated circuit devices, and more specifically to field effect transistors.

BACKGROUND OF THE INVENTION

Increased gate control, reduced body effect, reduced junction capacitance and lower junction leakage current are among the attributes of insulated gate field effect transistors (IGFETs) including metal-oxide-semiconductor field effect transistors (MOSFETs) fabricated in semiconductor-on-insulator (SOI) substrates. These attributes of SOI IGFETs have generated interest in their use in low voltage, low power applications. However, problems unique to the fabrication of devices on SOI substrates complicate the design of circuits thereon and add to the costs of development and production.

Unlike IGFET devices constructed on bulk silicon substrates which have bodies in electrical contact with the substrate and thereby exchange charge carriers with the substrate, SOI IGFETs have floating bodies which store charge carriers on a permanent or near permanent basis. This characteristic of SOI IGFET devices results in their electrical properties exhibiting hysteresis effects, wherein the SOI device behaves electrically as a function of its state during the preceding several hundred milliseconds of operation. In addition, the floating body of the SOI IGFET has been linked to reliability problems, such as increased susceptibility to device latch-up and increased hot carrier degradation as compared to conventional IGFETs built in bulk silicon substrates.

An obstacle to the acceptance of SOI IGFETs is the increased cost of SOI substrate fabrication, which involves additional process steps, for example, high dose oxygen implantation with long duration anneals at high temperature in silicon-implanted-with-oxygen (SIMOX) substrates, or the bonding of two prepared wafers and the polishing down of the top semiconductor layer to the desired thickness, as in bond-and-etchback SOI (BESOI).

Accordingly, it is an object of the invention to provide a field effect transistor having a substantially isolated body which nevertheless remains joined to a substrate for exchange of charge carriers therewith.

Another object of the invention is to provide a field effect transistor having a substantially isolated body to facilitate rapid switching speed, while maintaining body contact to substrate to avoid the deleterious results of the floating body described above.

Still another object of the invention is to provide a field effect transistor having a very short effective channel length.

Another object of the invention is to provide a field effect transistor having reduced junction capacitance.

A further object of the invention is to provide a method of fabricating a field effect transistor which has large channel width but occupies a small area of the semiconductor substrate.

Another object of the invention is to provide a field effect transistor having a body which has sublithographic thickness for providing enhanced device current.

Still another object of the invention is to provide a field effect transistor (FET) in which the gate conductor is wrapped around the body of the FET and the FET is electrically isolated from other circuit elements on the substrate by large isolation regions.

SUMMARY OF THE INVENTION

These and other objects are provided by the transistor having a substantially isolated body and method of fabricating the same of the present invention.

According to a first aspect of the invention, a field effect transistor (FET) includes a substantially isolated body, i.e., channel region, of semiconductor material joined to a semiconductor substrate through a neck region which permits exchange of charge carriers with the substrate. The body of the transistor is isolated from electrical contact with the substrate at surfaces other than the neck.

According to a preferred aspect of the invention, the body of the FET is formed on a sidewall of an isolation region in the substrate. In another preferred aspect of the invention, the body has a plurality of electrically isolated surfaces which comprise substantially all surface area of the body other than the surface at the neck, and the gate covers all of the electrically isolated surfaces.

In another preferred aspect of the invention, the body is formed in a sidewall spacer region of epitaxial semiconductor material having sublithographic thickness and which contacts a monocrystalline semiconductor substrate. Preferably, the substrate is implanted with dopant ions in a first implanting and a body region and source/drain regions are formed in the sidewall spacer region by a second implantation of dopant ions to form doped active device regions in registration with doped substrate regions.

In still another aspect of the invention, a method for forming a field effect transistor (FET) is provided which includes forming an isolation region in a semiconductor substrate, depositing a conformal material layer over the substrate, and anisotropically etching the conformal material and underlying semiconductor material such that semiconductor material remains on a sidewall of the isolation region as an active device region of the FET. Channel and source/drain regions are then formed by doping respective portions of the active device region to form respective doped regions of opposite dopant type.

In a preferred aspect of the invention, a method for forming a field effect transistor (FET) is provided which includes providing a semiconductor substrate having an upper layer of a first dopant concentration, a lower layer of a second dopant concentration, wherein the second dopant concentration is different from the first dopant concentration such that the lower layer forms an etch stop layer. A shallow trench isolation region is formed in the substrate and the upper layer is anisotropically etched until the etch stop layer is exposed such that material from the upper layer remains on a sidewall of the isolation region as a body of the FET. Then, doping concentrations in regions of the body are altered to form source-drain regions of a first dopant type and a channel region of a second dopant type opposite to the first dopant type. A gate is formed which overlays the channel region.

DETAILED DESCRIPTION OF THE PREFERRED EMBODIMENTS

Figure 1:
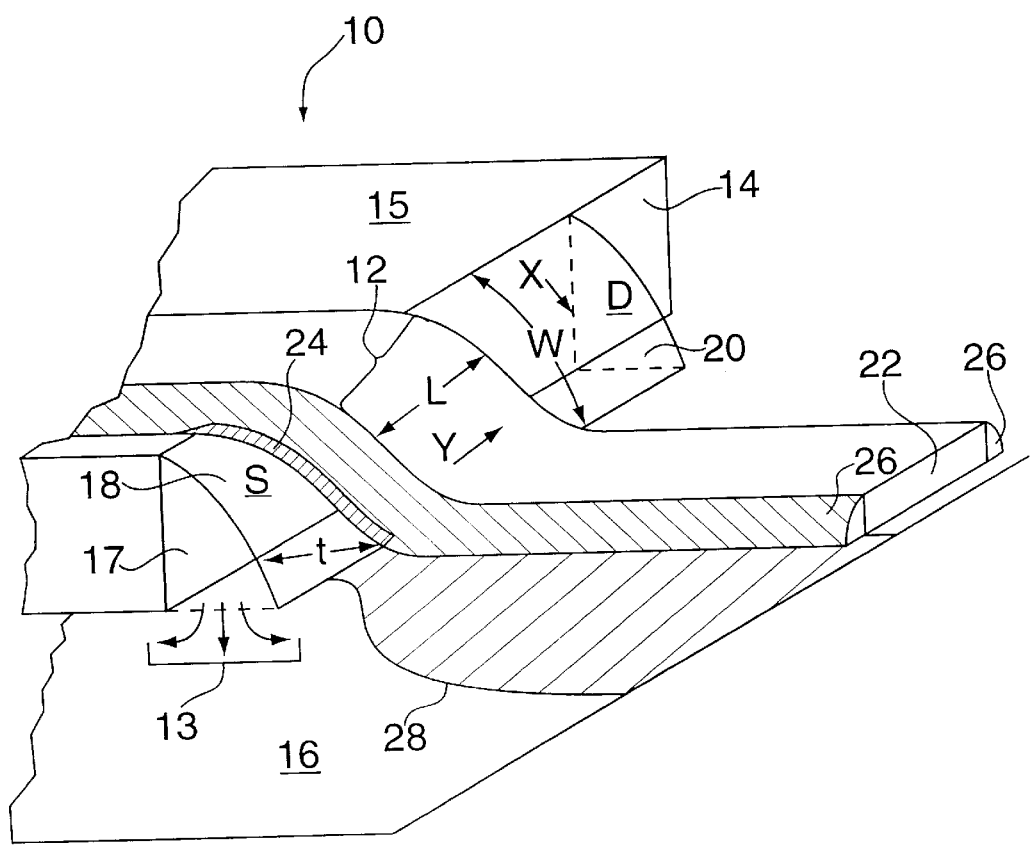
FIG. 1 is a perspective view of a field effect transistor (FET) constructed according to the present invention.

FIG. 1 contains a perspective view of an insulated gate field effect transistor (IGFET) according to the present invention. The IGFET 10 includes an active device region 17 of semiconductor material formed on a sidewall 14 of an isolation region 15 and overlaying a substrate 16 of semiconductor material. The semiconductor material of the active device region 17 and the substrate 16 are preferably silicon. The active device region 17 of IGFET 10 includes source and drain regions 18, 20 formed on respective sides of the body 12, i.e. the central channel region, which, in FIG. 1, is obstructed from view by gate conductor 22. A gate dielectric 24 is formed as a thin film on body 12 and separates the body 12 from the gate conductor 22 deposited thereon.

The active device region 17 of IGFET 10, which includes the body 12, and source and drain regions 18, 20, all in contact with substrate 16, is preferably formed of monocrystalline silicon. The device region 17 electrically and physically contacts the substrate through a neck region 13, but is otherwise isolated therefrom. Thus, charge carriers can pass between device region 17 and substrate 16 through neck region 13. Gate conductor 22 is preferably formed of polycrystalline silicon and covered by a conformal layer of silicon nitride 26 ($Si_xN_y$). Portions of the gate dielectric 24 overlaying source and drain regions 18, 20 are removed to form device contacts (not shown). Other portions of source and drain regions 18, 20 may remain covered by gate dielectric 24. Portions of the gate conductor 22 overlaying the substrate 16 are insulated therefrom by a field isolation region 28, which is preferably a field oxide grown by exposing the substrate 16 to an oxidizing ambient at elevated temperature after formation of the isolation region 15 and device region 17.

Figure 2:
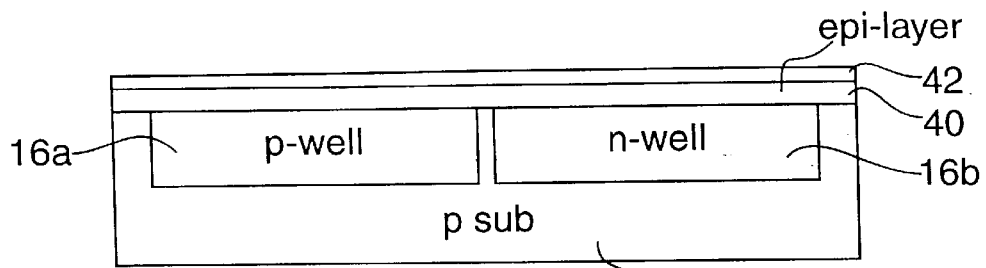
FIGS. 2 through 4, 5a–5c, and 7 through 11 contain cross-section views illustrating steps in the fabrication of a FET according to a first embodiment of the invention.

The fabrication of IGFET 10 according to a first embodiment of the invention will now be explained, with reference to FIGS. 2 through 4, 5a–5c and 7 through 11. Fabrication begins with a substrate of p-doped monocrystalline silicon, which has been prepared with heavily doped well regions 16a, 16b, formed, e.g., as by a well-known method of implanting ion species into the surface of substrate 16 (FIG. 2). As will be understood, if IGFET 10 is to be n-type, then a well region 16a will be doped p-type and IGFET 10 will be formed over that well region 16a. Conversely, if IGFET 10 is to be p-type, then a well region 16b will be doped n-type and IGFET 10 will be formed over that well region 16b. As will be further understood, if IGFET devices 10 of only n-type or only p-type are desired, then well regions 16a and 16b will be doped with the corresponding dopant type. After formation of the wells 16a and 16b, an epitaxial layer 40 ("epi layer") of intrinsic or lightly doped monocrystalline silicon is grown or formed on the exposed surface of substrate 16. Thereafter, a layer of silicon nitride 42 ($Si_xN_y$) is formed or deposited over the epi layer 40.

Figure 3:
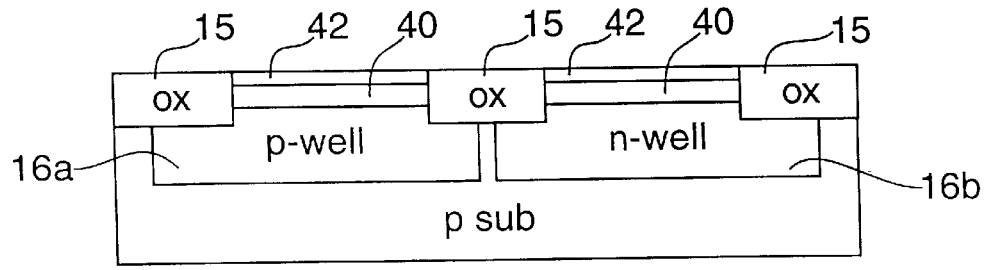

As shown in FIG. 3, isolation regions 15 are formed by depositing dielectric material into trenches etched into the layered structure. This step is preferably performed by anisotropically etching trenches into photolithographically patterned areas of the layered structure and depositing a dielectric material, preferably silicon dioxide by chemical vapor deposition (CVD) from a tetraethylorthosilicate (TEOS) precursor.

Figure 4:
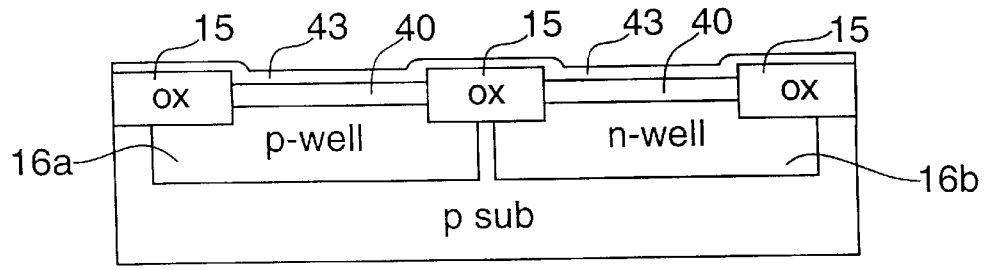
Figure 5A:
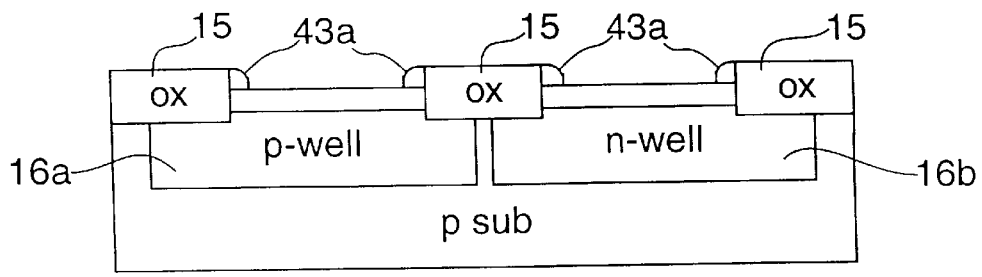

Nitride layer 42 is then removed, as by wet etching in hot phosphoric acid, and a conformal layer 43 of material, preferably silicon nitride is deposited, resulting in the structure shown in FIG. 4. The conformal layer 43 is then anisotropically etched, selective to silicon and to silicon dioxide, after which sidewall spacers 43a of the conformally deposited material (silicon nitride) remain which abut isolation regions 15 (FIG. 5a).

Figure 5B:
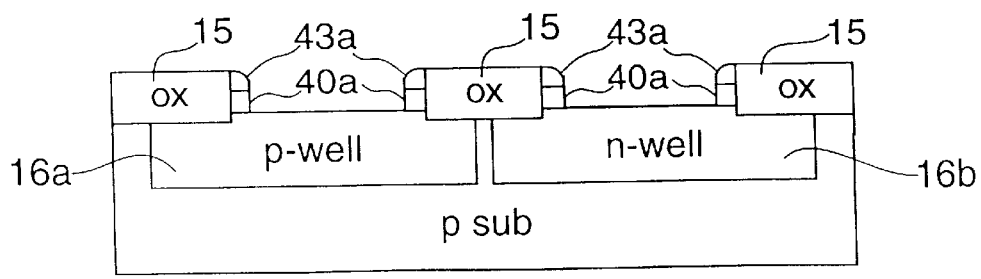
Figure 5C:
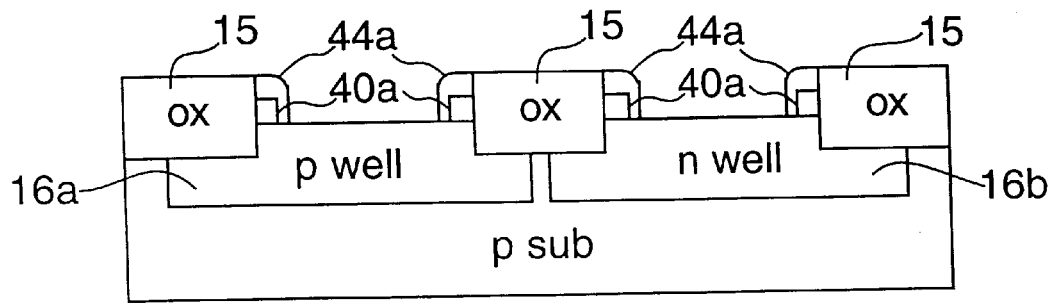
Figure 6A:
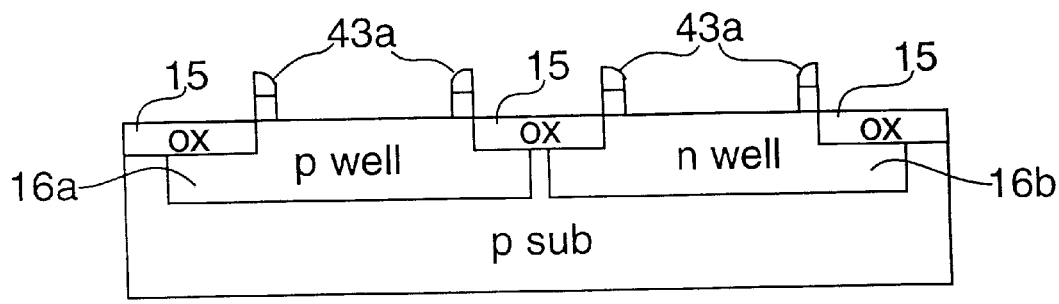
FIGS. 6a–6b contain cross-section views illustrating steps in the fabrication of a FET according to a second embodiment of the invention.
Figure 6B:
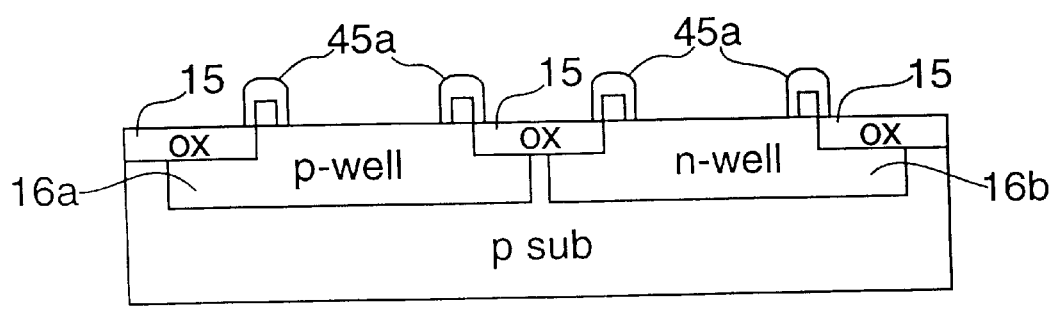

Anisotropic etching of the epi layer 40 is performed until the well regions 16a and 16b are exposed, as shown in FIG. 5b. This step is performed, for example, by reactive ion etching of the intrinsic or lightly doped epi layer 40, monitoring for changes concentration of plasma species in the reactive chamber, and terminating the etching when the underlying well regions 16a, 16b of the substrate 16 become exposed. After epi layer 40 is etched, an additional layer of conformally deposited material, preferably silicon nitride, is deposited and anisotropically etched to form a sidewall spacer 44a which covers device regions 40a and abuts shallow trench isolation region 15 while contacting wells 16a and 16b (FIG. 5c).

Figure 7:
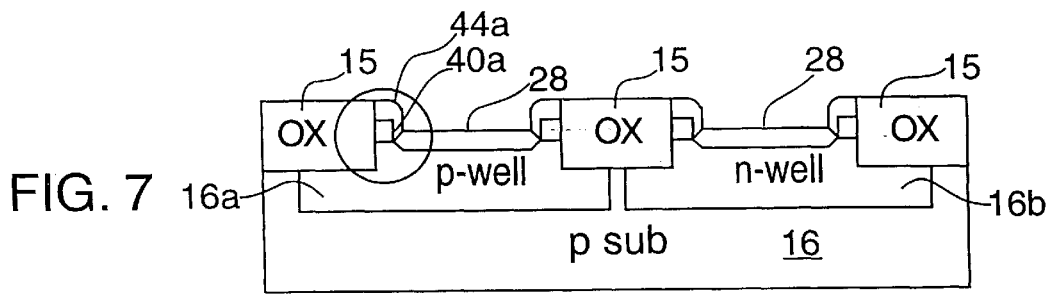
Figures 8, 9:
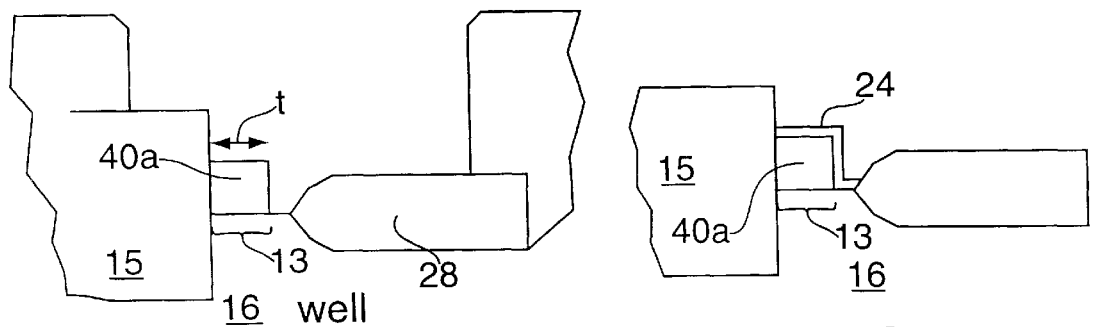

Other isolation regions 28 are then formed in exposed portions of the silicon substrate 16, preferably by forming a field oxide (FOX) by local oxidation of silicon (LOCOS), which results in the structure as shown in FIG. 7. As shown in FIG. 8, the nitride portion 44a of the sidewall spacer is then removed, for example, by wet etching, and ion implantation is performed into the device region 40a which remains. As will be understood, since the thickness t of the device region 40a has been defined by a sidewall spacer technique rather than by etching of a photolithographically determined pattern, the resulting device region 40a of semiconductor material has thickness of sublithographic dimension. The small thickness of the transistor improves the current output of the transistor by reducing the volume of body 12, which, in turn, increases the density of charge carriers within the body 12. As to the width dimension W of the device region 40a, since W lies in a substantially vertical direction with respect to substrate 16, that dimension can be increased as needed without increasing the amount of surface area occupied by the transistor.

To form an n-type IGFET, the device silicon 40a, which overlays a p-well region 16a, is preferably implanted with ions to alter the dopant concentration and/or dopant type therein to p-type doping. Alternatively, in forming an p-type IGFET, device silicon 40a, which overlays an n-well region 16b, is preferably implanted with ions to alter the dopant concentration and/or dopant type therein to n-type doping. As is apparent from FIG. 8, device region 40a is electrically and physically joined to substrate 16 through a neck region 13, but otherwise isolated therefrom. Thus, as will be understood, in the resulting IGFET structure 10, the flow of charge carriers between device region 40a and substrate 16 is significantly reduced in relation to that in conventional IGFETs formed in bulk silicon substrates, but nevertheless sufficient to avoid the hysteresis and reliability problems of SOI devices described above.

A gate dielectric 24 is formed as a thin film over the device silicon 40a, resulting in a structure as shown in FIG. 9. The gate dielectric 24 is preferably silicon dioxide ($SiO_2$) or nitrided silicon dioxide, a high K dielectric material such as tantalum oxide ($TaO_5$), or even a layered dielectric such as silicon dioxide—silicon nitride—silicon dioxide (ONO). Depending upon the application to which the IGFET 10 is to be put, and the material to be selected as a gate conductor 22, the gate dielectric 24 may even be an ultra high K dielectric material such as SrTiO3, BaSrTiO3.

Figure 10:
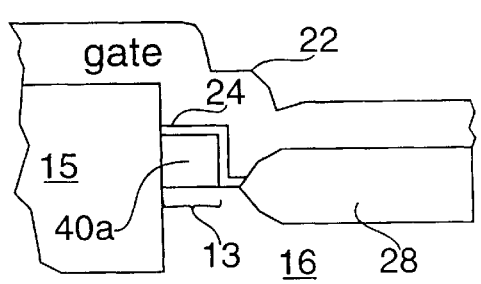
Figure 11:
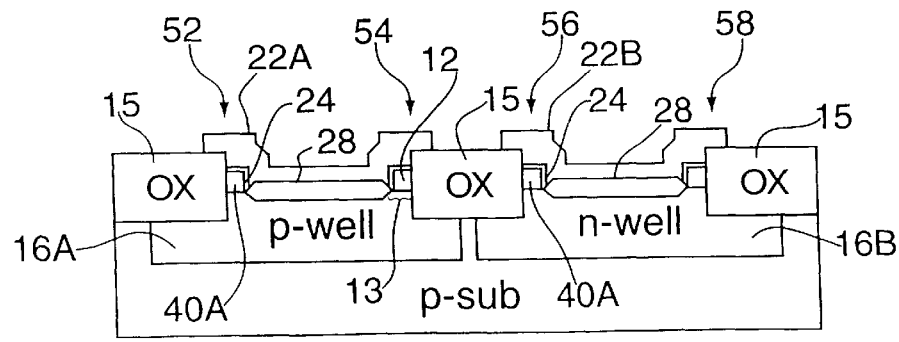

After the gate dielectric 24 is formed, a gate conductor 22 of a material such as polycrystalline silicon (polysilicon); a metal such as tungsten (W), aluminum (Al); or a composite layered conductor such as polysilicon, and a silicide of tungsten or other metal is deposited thereon (FIG. 10). The gate conductor 22 is then patterned and etched, as by reactive ion etching (RIE), which results in a structure as shown in FIG. 11, and may include IGFET devices which are joined by the same gate conductor, for example, devices 52, 54 joined by gate conductor 22a.

Figure 12:
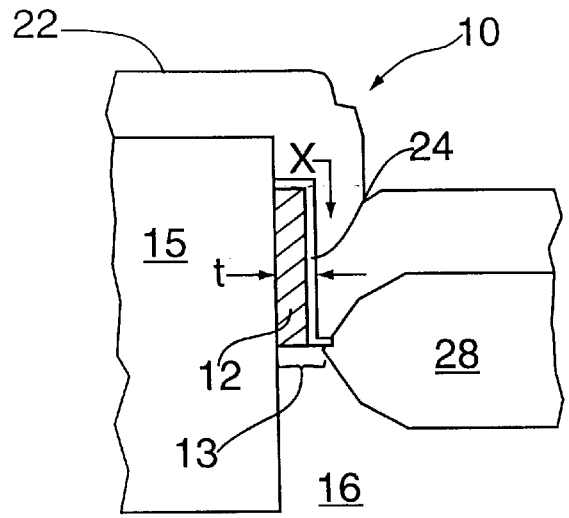
FIG. 12 contains a cross-section view of a FET constructed according to a first embodiment of the invention in which the body abuts a sidewall of an isolation region.

An IGFET device 10, formed according to a first embodiment by the foregoing described process, is shown in FIG. 12. In this embodiment, body 12 is supported on a sidewall of a shallow trench isolation region 15. Isolation of device 10 is asymmetric in that body 12 of device 10 is supported on one side on a sidewall of shallow trench isolation region 15 but is isolated on another side from other circuit elements (not shown) by field oxide region 28. As will be understood from FIG. 12, the width to length (W/L) ratio of the device 10 is high because the outer perimeter X of the body 12 is the channel width W of the IGFET, while the length L is the smaller dimension over which the gate conductor extends in the linear direction Y of the body, as shown in FIG. 1. Moreover, since the width W of device 10 extends substantially in the vertical direction, the W/L ratio can be increased without a substantial change in the fabrication process by increasing the thickness of the epi-layer 40 and etching to the corresponding depth, as described above with reference to FIG. 5b. In addition, the W/L ratio can be increased or decreased as desired without change in the amount of area which is occupied by the completed device 10 on the surface of a wafer.

As will be understood, it is highly desirable to define the thickness t of the body 12 on a sublithographic scale to provide small body volume which, in turn, permits strong gate control and low back bias sensitivity. The fabrication process described herein results in the body 12 of the IGFET having a thickness t (FIG. 12) defined on a sublithographic scale.

Figure 13:
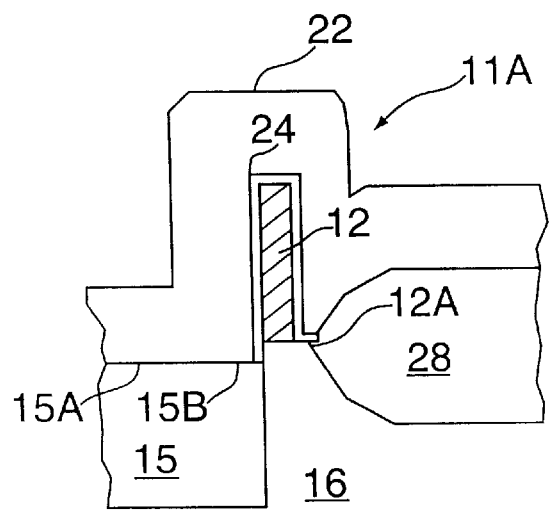
FIG. 13 contains a cross-section view of a FET constructed according to a second embodiment of the invention in which an isolation region is over recessed and the gate conductor is wrapped around the body of the transistor.
Figure 14:
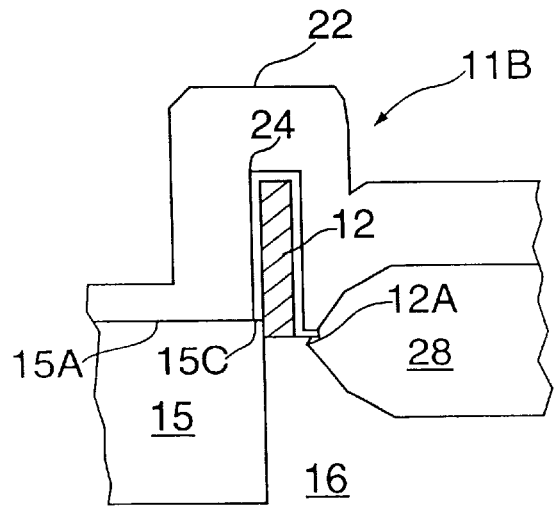
FIG. 14 contains a cross-section view of a FET constructed according to a second embodiment of the invention in which an isolation region is under recessed and the gate conductor is wrapped around the body of the transistor.

FIGS. 13 and 14 contain cross section views showing the IGFET devices 11a and 11b constructed according to a second embodiment in which the gate conductor 22 is wrapped around the channel region 12. As will be understood, shall trench isolation region 15 and field oxide region 28 form large isolation regions which largely eliminate parasitic capacitances and unwanted coupling between adjacent devices, e.g. IGFETs 11a, on the substrate 16.

As will be described more fully below, in each case, the structure of devices 11a and 11b is achieved by recessing the shallow trench isolation region 15 such that the channel region 12 generally extends above the top surface 15a of the shallow trench isolation region 15. More specifically, FIG. 13 shows an IGFET 11a in which shallow trench isolation region 15 has been over recessed to point 15b which lies below point 12a where channel region 12 contacts the semiconductor region of substrate 16. On the other hand, FIG. 14 shows an IGFET 11b in which shallow trench isolation region 15 has been under recessed to point 15c which lies above point 12a where channel region 12 contacts the semiconductor region of substrate 16.

As will be understood by the process description which follows, the depth to which shallow trench isolation region 15 is recessed can be selectively controlled to adjust parameters of the IGFET such as threshold voltage $V^T$. It will be further understood that when it is desired to fabricate devices having such wrap-around gates in applications requiring very high gate coupling to the channel, process conditions must be well controlled and substantially uniform across a region of interest, for example, over the area of an integrated circuit chip.

The process of fabricating devices 11a and 11b according to a second embodiment of the invention will now be explained. Fabrication begins as according to the first embodiment of the invention, as described with reference to FIGS. 1 to 4, and 5a–5b, such that sidewall spacers having a layered construction of conformal material 43a over a device region 40a of monocrystalline semiconductor are formed on sidewalls of shallow trench isolation regions 15.

Next, instead of proceeding according to the foregoing described process step shown in FIG. 5c, the shallow trench isolation region 15 is recessed by a directional, preferably anisotropic, silicon oxide etch which is selective to silicon and silicon nitride. The duration of this etch is controlled in accordance with the depth of the recess by which desired properties of the IGFET 11a, 11b are obtained. For example, for applications requiring lower threshold voltage $V_T$, it may be desirable to recess the shallow trench isolation region 15 to a depth at point 15b (FIG. 13) which is greater than the depth of recess (point 15c; FIG. 14) required for higher threshold voltage $V_T$.

Next, a layer of conformal material, preferably silicon nitride, is deposited, typically by chemical vapor deposition (CVD) and then anisotropically etched, or directionally etched, selective to silicon and silicon oxide. This results in the formation of a protective conformal layer 45a of silicon nitride over the device region 40a which protects the device region 40a from oxidation during formation of a field oxide layer 28 (FIG. 7) by a LOCOS process. Fabrication of devices 11a, 11b are completed by the steps described above with reference to FIGS. 7 through 11.

While the invention has been described herein with reference to certain preferred embodiments thereof, those skilled in the art will recognize the many modifications and enhancements which can be made without departing from the true scope and spirit of the invention.

What is claimed is:

1. A method of forming a field effect transistor (FET), comprising the steps of:

forming a trench isolation region having a substantially vertical sidewall in a substrate having at least an upper layer of semiconductor material;

anisotropically etching said substrate such that a sidewall spacer region of said semiconductor material remains on said substantially vertical sidewall of said trench isolation region as a device region of said FET, said spacer region providing a conductive path for exchange of charge carriers with at least said upper layer of said substrate outside of said spacer region;

altering a doping concentration in at least a portion of said spacer region such that source-drain regions and a channel region are formed therein such that the width of said channel region of the completed FET lies in a substantially vertical direction, said source-drain regions having a first dopant type, and said channel region having a second dopant type opposite said first dopant type; and forming a gate overlaying said channel region to form said FET.

2. The method of claim 1 wherein said step of forming said trench isolation region includes etching a trench and depositing an insulator material to form said trench isolation region.

3. The method of claim 1 further comprising the steps of:

prior to said step of etching, forming an epitaxial layer of monocrystalline semiconductor material on said upper semiconductor layer of said substrate, said epitaxial layer having a different dopant concentration than said upper layer such that said upper layer forms an etch stop layer, and wherein said step of etching is performed until said etch stop layer is exposed.

4. The method of claim 3 wherein said epitaxial layer is formed of intrinsic semiconductor material and said step of altering includes implanting ions of a first dopant type to form said channel region and implanting ions of a second dopant type to form said source and drain regions.

5. The method of claim 2 wherein said trench isolation region is formed with a top surface rising above a top surface of said upper layer of semiconductor material in said substrate, and said method further comprises the step of, prior to said step of etching:
  depositing a layer of conformal material on an exposed surface of said upper layer, and
  said step of etching further comprises anisotropically etching said conformal material layer such that material from said conformal layer remains on said sidewall of said trench isolation region as a mask in forming said device region.

6. The method of claim 5 wherein said conformal material is silicon nitride.

7. The method of claim 1 wherein said method further comprises forming a second isolation region in said substrate at a location not already occupied by said trench isolation region and said device region, said second isolation region electrically isolating a gate conductor of said gate from said substrate.

8. The method of claim 7 wherein said second isolation region is formed as a field oxidation region by exposing said substrate to oxygen.

9. A method of forming a field effect transistor (FET) having a channel region substantially enclosed by a gate conductor, comprising the steps of:

forming a first trench isolation region having a substantially vertical sidewall in a substrate having at least an upper layer of semiconductor material;

anisotropically etching said substrate such that a sidewall spacer region of said semiconductor material remains on said substantially vertical sidewall of said trench isolation region as a device region of said FET, said spacer region providing a conductive path for exchange of charge carriers with at least said upper layer of said substrate outside of said spacer region;

recessing said first trench isolation region such that a top surface of said recessed first trench isolation region lies below a top surface of said device region;

altering a doping concentration in at least a portion of said spacer region such that source-drain regions and a channel region are formed therein such that the width of said channel region of the completed FET lies in a substantially vertical direction, said source-drain regions having a first dopant type, and said channel region having a second dopant type opposite said first dopant type; and depositing a gate conductor over said channel region to substantially enclose said channel region, thereby forming said FET.

10. The method of claim 9 wherein said step of etching recesses said substrate to a first depth, and said step of recessing recesses said first trench isolation region to a depth in said substrate substantially the same as said first depth.

11. The method of claim 9 further comprising the step of forming a second isolation region in said substrate on an opposite side of said FET from said first trench isolation region.

12. The method of claim 11 wherein said first trench isolation region is a shallow trench isolation region.

13. The method of claim 12 wherein said second isolation region is a formed by local oxidation of silicon.

14. The method of claim 9 wherein said first trench isolation region is a shallow trench isolation region having a top surface rising above a top surface of said upper layer of semiconductor material in said substrate, and said method further comprises the step of, prior to said step of etching:
  depositing a layer of conformal material on an exposed surface of said upper layer; and
  said step of etching further comprises anisotropically etching said conformal material layer such that material from said conformal layer remains on said sidewall of said shallow trench isolation region as a mask in forming said device region.

15. The method of claim 14 wherein said step of etching forms a device region of sublithographic thickness.

* * * * *